US006846608B2

(12) United States Patent
Zheng et al.

(10) Patent No.: US 6,846,608 B2
(45) Date of Patent: Jan. 25, 2005

(54) METHOD TO REDUCE IMAGING EFFLUENCE IN PROCESSLESS THERMAL PRINTING PLATES

(75) Inventors: Shiying Zheng, Webster, NY (US); Elizabeth Knight, Lafayette, CO (US); Thap Dominh, Winter Haven, FL (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 72 days.

(21) Appl. No.: 09/998,685

(22) Filed: Nov. 29, 2001

(65) Prior Publication Data

US 2003/0124317 A1 Jul. 3, 2003

(51) Int. Cl.[7] .......................... G03F 7/004; G03F 7/016

(52) U.S. Cl. ................. 430/270.1; 430/171; 430/281.1; 430/283.1; 430/286.1; 430/288.1; 430/302; 430/348; 430/964

(58) Field of Search ................................ 430/171, 964, 430/270.1, 271.1, 273.1, 281.1, 283.1, 284.1, 286.1, 287.1, 288.1, 302, 348, 944, 945

(56) References Cited

U.S. PATENT DOCUMENTS

| | | | | | |
|---|---|---|---|---|---|
| 5,506,090 | A | | 4/1996 | Gardner, Jr. et al. | 430/302 |
| 5,922,512 | A | | 7/1999 | DoMinh | 430/302 |
| 5,939,237 | A | | 8/1999 | Gardner, Jr. et al. | 430/273.1 |
| 5,985,514 | A | | 11/1999 | Zheng et al. | 430/270.1 |
| 6,040,115 | A | | 3/2000 | Bailey et al. | 430/303 |
| 6,136,503 | A | | 10/2000 | Zheng et al. | 430/270.1 |
| 6,146,812 | A | | 11/2000 | Leon et al. | 430/270.1 |
| 6,162,578 | A | | 12/2000 | Zheng et al. | 430/270.1 |
| 6,190,830 | B1 | | 2/2001 | Leon et al. | 430/270.1 |
| 6,190,831 | B1 | | 2/2001 | Leon et al. | 430/270.1 |
| 6,261,740 | B1 | | 7/2001 | Nguyen et al. | 430/271.1 |
| 6,410,202 | B1 | * | 6/2002 | Fleming et al. | 430/270.1 |
| 6,413,694 | B1 | * | 7/2002 | Zheng et al. | 430/270.1 |
| 6,558,875 | B1 | * | 5/2003 | Toshimitsu et al. | 430/302 |
| 6,579,662 | B1 | * | 6/2003 | Zheng et al. | 430/281.1 |
| 2003/0113653 | A1 | * | 6/2003 | Zheng et al. | 430/138 |

FOREIGN PATENT DOCUMENTS

| | | | | |
|---|---|---|---|---|
| EP | 0703499 | | 3/1996 | |
| EP | 703 499 | A1 * | 3/1996 | G03F/7/11 |
| EP | 0987104 | | 3/2000 | |
| EP | 1110628 | | 6/2001 | |
| GB | 2325885 | | 12/1998 | |
| JP | 200071635 | | 3/2000 | |
| JP | 2001162962 | | 6/2001 | |
| WO | 9855311 | | 12/1998 | |

* cited by examiner

*Primary Examiner*—Barbara Gilliam
(74) *Attorney, Agent, or Firm*—Faegre & Benson, LLP

(57) ABSTRACT

A method to reduce effluence during or immediately after imaging of a printing plate is described. In one embodiment of the invention, the method comprises: (a) applying to a substrate a coating composition comprising a photothermal converter and at least one polymer comprising thiosulfate groups to obtain a coating; and (b) applying a water soluble topcoat to the coating. Preferably, the water soluble topcoat does not comprise a photothermal converter. In another embodiment of the invention, the method comprises applying to a substrate a composition comprising: (a) a photothermal converter; (b) at least one polymer comprising thiosulfate groups; and (c) an additive selected from the group consisting of diazonium, iodonium, copper(I), alkoxypyridinium or maleimide additives.

16 Claims, No Drawings

METHOD TO REDUCE IMAGING EFFLUENCE IN PROCESSLESS THERMAL PRINTING PLATES

BACKGROUND OF THE INVENTION

1. Field of the Invention

This invention is directed to lithographic printing plates comprising a hydrophilic polymer containing thiosulfate groups. More particularly, this invention is directed to a method to reduce the imaging effluence of printing plates comprising a thiosulfate polymer.

2. Background Information

One approach to process-on-press printing plates includes the use of polymers containing thiosulfate groups, which cause the polymer to be water soluble or water dispersible. Upon heating, chemical and/or physical changes to the polymer cause it to become water insoluble. Thus, when such polymers are used in the coating of a lithographic printing plate in conjunction with a photothermal converter such as carbon black or an IR dye, the plate may be imaged with an IR laser and then placed directly on the press without an intermediate processing step. The coating in the non-imaged areas is removed by the fountain and/or ink of the press while the coating in the imaged areas is retained. The retained coating is oleophilic while the substrate exposed upon coating removal in the non-imaged areas is oleophobic.

A disadvantage to this approach is that there may be an objectionable effluence upon imaging the plate due to the presence of the thiosulfate groups. The term effluence as used herein is intended to mean an odor that flows out of the printing plate or out of the printing plate coating.

Processless printing plates, which do not require a chemical development step, have been described in U.S. Pat. No. 5,922,512, U.S. Pat. No. 6,040,115, U.S. Pat. No. 6,190,830, U.S. Pat. No. 6,190,831, and U.S. Pat. No. 6,261,740, which disclose imageable elements containing heat-sensitive polymers. The heat-sensitive polymers provide imaging means without wet processing. None of these patents disclose thiosulfate-containing polymers.

Printing plates comprising thiosulfate-containing polymers have been described in U.S. Pat. No. 6,162,578, U.S. Pat. No. 6,146,812, U.S. Pat. No. 6,136,503, and U.S. Pat. No. 5,985,514. The imaging layer in these patents is the only layer. None of the patents describe printing plates that include topcoats or printing plates that include diazonium, iodonium, copper(I), alkoxypyridinium or maleimide additives.

WO 98/55311 is directed to a lithographic printing plate that contains a metallic imaging layer. The plate works by ablation of the metallic layer from the aluminum support. The topcoats include polyvinyl alcohol, gum arabic, polyvinylphophonic acid, carboxymethylcellulose, and polyethylene glycol. The patent does not describe an imaging layer containing a thiosulfate copolymer.

U.S. Pat. No. 5,939,237 is directed to an article mounted on a press. The article comprises a photosensitive composition. The patent does not describe a thermal printing plate. The hydrophilic areas of the coating are not designed to be washed off.

U.S. Pat. No. 5,506,090 is directed to a photosensitive composition. The patent does not describe a thermal printing plate.

JP 2000 071635 describes a printing plate containing a thermally sensitive layer. The imaging layer is hydrophobic and becomes hydrophilic with heat. The thermally sensitive layer does not comprise a thiosulfate-containing polymer.

JP 2001 162962 describes a printing plate with a topcoat laminated onto the plate. The topcoat contains an IR dye, while the bottom coat does not. The patent is not directed to reducing or eliminating effluence from a printing plate. The thermally sensitive layer does not comprise a thiosulfate-containing polymer.

None of the methods in the prior art provides a method to reduce effluence during the imaging of printing plates comprising thiosulfate-containing polymers by application of a water soluble top-coat or by using formulations containing diazonium, iodonium, copper(I), alkoxypyridinium or maleimide additives.

We have found that application of a water soluble top-coat or the use of a coating composition comprising a photothermal converter and diazonium, iodonium, copper(I), alkoxypyridinium or maleimide additives to the plate significantly reduces or eliminates the objectionable effluence that normally arises upon imaging of a printing plate comprising thiosulfate-containing polymers. The present invention has the advantage of allowing the preparation of printing plates comprising thiosulfate-containing polymers that become insoluble upon thermal imaging while reducing or eliminating the effluence associated with such polymers.

SUMMARY OF THE INVENTION

In one aspect, the invention relates to a method to reduce effluence during or immediately after imaging of a printing plate, the method comprising: (a) applying to a substrate a coating composition comprising a photothermal converter and at least one polymer comprising thiosulfate groups to obtain a coating; and (b) applying a water soluble topcoat to the coating. Preferably, the topcoat does not comprise a photothermal converter.

In another aspect, the invention relates to a method to reduce effluence during or immediately after imaging of a printing plate, the method comprising applying to a substrate a composition comprising: (a) a photothermal converter; (b) at least one polymer comprising thiosulfate groups; and (c) an additive selected from the group consisting of diazonium, iodonium, copper(I), alkoxypyridinium and maleimide additives and mixtures thereof.

In another aspect, the invention relates to a method for producing a printing plate comprising: (a) applying to a substrate a coating composition comprising a photothermal converter and at least one polymer comprising thiosulfate groups to obtain a coating; and (b) applying a water soluble topcoat to the coating. Preferably, the topcoat does not comprise a photothermal converter.

In another aspect, the invention relates to a method for producing a printing plate comprising applying to a substrate a composition comprising: (a) a photothermal converter; (b) at least one polymer comprising thiosulfate groups; and (c) an additive selected from the group consisting of diazonium, iodonium, copper(I), alkoxy-pyridinium and maleimide additives and mixtures thereof.

In another aspect, the invention relates to a printing plate precursor comprising: (a) a coating applied to a substrate, the coating comprising a photothermal converter and at least one polymer comprising thiosulfate groups; and (b) a water soluble topcoat residing on the coating. Preferably, the topcoat does not comprise a photothermal converter.

In another aspect, the invention relates to a printing plate precursor comprising: (a) a substrate; and (b) a coating applied to the substrate, the coating comprising (i) a photothermal converter; (ii) at least one polymer comprising thiosulfate groups; and (iii) an additive selected from the group consisting of diazonium, iodonium, copper(I), alkoxypyridinium and maleimide additives and mixtures thereof.

In one embodiment of the present invention, the additive may be used as a topcoat which optionally comprises a photothermal converter. In another embodiment, the additive is coated with the thiosulfate polymer and the photothermal converter.

The present invention is useful in the production of process-on-press printing plates that make use of thiosulfate-containing polymers. In particular, the invention enables imaging of a printing plate comprising at least one thiosulfate-containing polymer and an IR dye.

DETAILED DESCRIPTION OF THE INVENTION

The photothermal converter of the present invention may comprise a carbon black or a dye that absorbs in the infrared region. In one preferred embodiment of the invention, the photothermal converter is an infrared dye selected from the group consisting of compounds I–V, where TEA is triethylammonium:

I

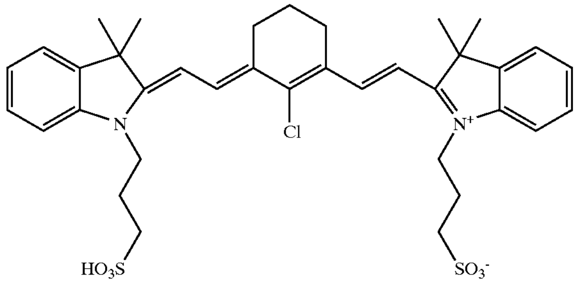

II

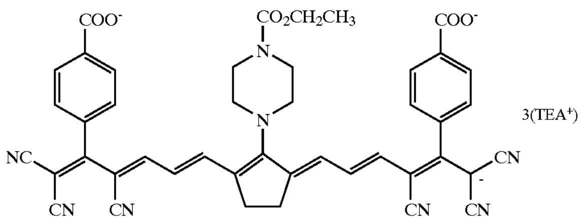

III

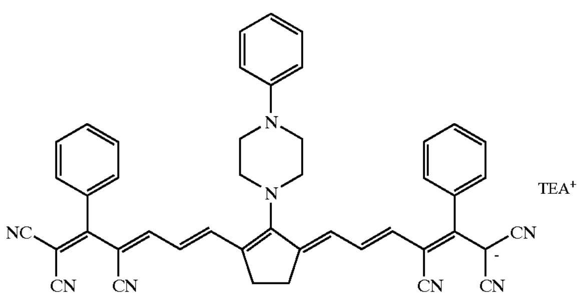

-continued

IV

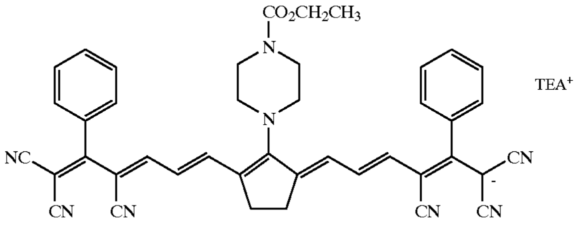

V

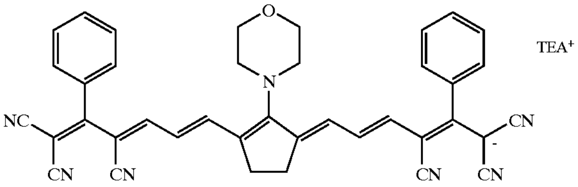

The polymer comprising thiosulfate groups has a molecular weight in the range of 1,000–1,000,000. The number of thiosulfate-containing monomeric units in the polymer is about 10% to about 100% of the total number of monomeric units. In a preferred embodiment, the polymer comprising thiosulfate groups is the polymer having structure VIa:

VIa

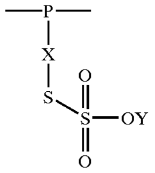

wherein P represents a polymeric backbone, Y is a hydrogen or a cation, and X is a divalent linking group.

Useful polymeric backbones include, but are not limited to, vinyl polymers, polyethers, polyamides, polyimides, polyurethanes, polyesters, or polyphenylenes. Preferably, the polymeric backbone is a vinyl polymer or polyether.

Y may be hydrogen, ammonium ion, or a metal ion, including a sodium, potassium, magnesium, calcium, cesium, barium, zinc or lithium ion. Preferably, Y is hydrogen, sodium ion, ammonium ion, or potassium ion.

Useful X linking groups include $—(COO)_n(Z_1)_m—$ wherein n is 0 or 1, m is 0 or 1, and $Z_1$ is a substituted or unsubstituted alkylene group having 1 to 6 carbon atoms (such as methylene, ethylene, n-propylene, isopropylene, a butylene, 2-hydroxypropylene and 2-hydroxy-4-azahexylene) that can have one or more oxygen, nitrogen or sulfur atoms in the chain, a substituted or unsubstituted arylene group having 6 to 14 carbon atoms in the aromatic ring (such as phenylene, naphthalene, anthracylene and xylylene), or a substituted or unsubstituted arylenealkylene (or alkylenearylene) group having 7 to 20 carbon atoms in the chain (such as p-methylenephenylene, phenylenemethylene-phenylene, biphenylene and phenyleneisopropylenephenylene). In addition, X can be an alkylene group, an arylene group, or an arylenealkylene group as defined above for $Z_1$.

Preferably, X is an alkylene group of 1 to 3 carbon atoms, an arylene group of 6 carbon atoms in the aromatic ring, an arylenealkylene group of 7 or 8 carbon atoms in the chain, or $—COO(Z_1)_m—$ wherein $Z_1$ is methylene, ethylene or phenylene. Most preferably, X is phenylene, methylene or —COO—.

As the thiosulfate group is generally arranged pendant to the backbone, preferably it is part of an ethylenically unsaturated polymerizable monomer that can be polymerized using conventional techniques to form vinyl homopolymers of the thiosulfate-containing recurring units, or vinyl copolymers when copolymerized with one or more additional ethylenically unsaturated polymerizable monomers. Preferably, the polymer comprising thiosulfate groups is represented by the following structure VIb:

VIb

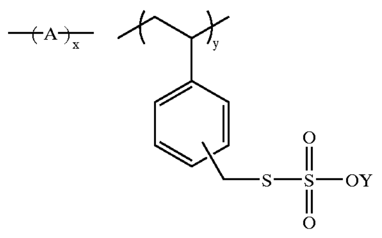

where Y is defined as in structure VIa, x may be zero, or a nonzero value, y has a nonzero value, the ratio x:y ranges from 0 to about 9, and units A are ethylenically unsaturated polymerizable comonomers, which may include but are not limited to, acrylates, methacrylates, styrene and its derivatives, acrylamides, methacrylamides, olefins, vinyl halides, or combinations thereof. Preferably, units A are selected from the group consisting of methacrylates and acrylates.

In a particularly preferred embodiment, the polymer comprising thiosulfate groups is represented by the following structure VIc:

VIc

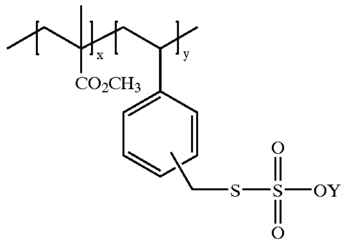

where Y is defined as in structures VIa and VIb, x may be zero, or a nonzero value, y has a nonzero value, and the ratio x:y ranges from 0 to about 9.

The coating composition may also comprise a solvent. Preferably, the solvent is selected from water, water soluble solvents including methanol, methyl ethyl ketone, propanol, and mixtures thereof.

In a preferred embodiment of the invention, the coating composition comprising a photothermal converter and at least one polymer comprising thiosulfate groups contains about 1 to about 25% by weight of solids, preferably about 2 to about 4% of solids. The formulation is coated onto a grained and anodized aluminum substrate having a thickness of about 0.12 to about 0.51 mm, preferably 0.14 mm, to produce a dry coverage of about 10–1000 mg/ft$^2$, preferably about 100 mg/ft$^2$. Preferably, the water soluble topcoat comprises about 2% by weight of solids.

The water soluble top-coat may include a polymer. Preferably, the polymer is a water soluble polymer containing monomeric units selected from the group consisting of amide units, polyoxazoline units, and mixtures thereof. Preferably, the polyoxazoline is poly(2-ethyl-2-oxazoline). Preferably, the water soluble polymer is selected from poly(N-vinylpyrrolidone), a copolymer of N-vinylpyrrolidone and vinyl acetate (poly(N-vinylpyrrolidone/vinyl acetate)), poly(2-ethyl-2-oxazoline), and mixtures thereof. The topcoat polymer can include more than one type of polymer. The solution from which the topcoat polymer is coated may include an organic solvent. Preferably, the organic solvent is toluene, ethyl acetate, dichloroethane, dichloromethane, a ketone such as methyl ethyl ketone, diethyl ketone, or methyl isobutyl ketone, or mixtures thereof.

The additive of the invention may be a diazonium, iodonium, copper(I), alkoxypyridinium or maleimide additives or mixtures thereof. Preferably, the diazonium additive is selected from the group consisting of compounds VII and VIII:

VII

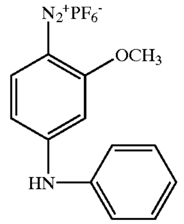

VIII

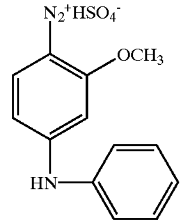

Preferably, the iodonium additive is compound IX:

IX

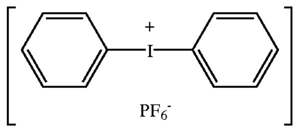

Preferably, the copper(I) additive is copper(I) gluconate.

Preferably, the alkoxypyridinium additive is compound X:

X

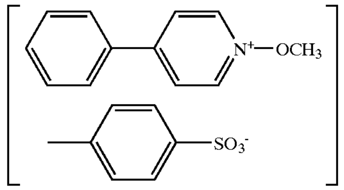

Preferably, the maleimide additive is N-ethylmaleimide, compound XI:

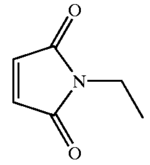

XI

EXAMPLES AND COMPARATIVE EXAMPLES

In the examples of Tables I–IV, the thermally sensitive formulations were prepared as indicated in Table I (parts by weight). The thiosulfate polymer is represented by structure VIc described above. Each formulation containing 4% by weight of solids was coated onto a grained and anodized 0.14 mm aluminum substrate to provide a dry coverage of 100 mg/ft$^2$. The resulting plates were allowed to air dry for 24 hours before any top-coat was applied. The top-coat formulations are indicated in Table II. Each formulation contained 2% by weight of solid and was coated onto the heat-sensitive coating to provide a dry coverage of 50 mg/ft$^2$. The printing plates illustrated in this invention are shown in Table III.

Each printing plate was imaged at 830 nm on an experimental plate setter having an array of laser diodes, each focused to a spot diameter of 23 μm and each channel providing a maximum of 450 mW of power incident on the recording surface. The plate was mounted on a drum whose rotation speed was varied to provide for a series of images set at various exposures: 364, 447, 579, and 820 mJ/cm$^2$. The exposure levels do not necessarily correspond to the optimum exposure levels for the tested printing plates.

Each imaged printing plate was mounted on the plate cylinder of a commercially available full-page printing press (A. B. Dick 9870 duplicator) for a press run. A commercial black ink and Varn Universal Pink fountain solution (from Varn Products Co.) were used. Each printing plate was developed on press and printed for at least 1,000 impressions.

TABLE I

Thermally sensitive formulations*

| Components | Formulation 1 | Formulation 2 | Formulation 3 |
|---|---|---|---|
| Thiosulfate polymer | 0.33 | 0.33 | 0.33 |
| Compound I | 0.033 | — | — |
| Compound II | — | 0.033 | — |
| Compound III | — | — | 0.033 |
| De-ionized water | 3.24 | 3.24 | 3.24 |
| Methanol | 5.40 | 5.40 | 0.90 |
| Methyl ethyl ketone | — | — | 4.50 |

*Units are in grams out of a total formulation weight of 9 g.

TABLE II

Top-coat formulations

| Components | Formulation 4 | Formulation 5 | Formulation 6 | Formulation 7 |
|---|---|---|---|---|
| PVP | 0.18 | 0.18 | — | — |
| PVP-PVA | — | — | 0.18 | — |
| PEOZ | — | — | — | 0.18 |
| Toluene | — | — | — | 4.41 |
| Ethyl acetate | — | — | 8.82 | 4.41 |
| Dichloroethane | — | 8.82 | — | — |
| Dichloromethane | 8.82 | — | — | — |

PVP: poly(N-vinylpyrrolidone), purchased from Polysciences, Inc., MW = 40,000.
PVP-PVA: poly(N-vinylpyrrolidone/vinyl acetate) (60:40), purchased from Polysciences, Inc.
PEOZ: poly(2-ethyl-2-oxazoline), purchased from Aldrich, MW = 50,000.

TABLE III

Printing Plate Examples

| Examples | Thermally sensitive formulation | Top-coat formulation |
|---|---|---|
| Comparative Example 1 | Formulation 1 | — |
| Example 1 | Formulation 1 | Formulation 5 |
| Comparative Example 2 | Formulation 2 | — |
| Example 2 | Formulation 2 | Formulation 5 |
| Example 3 | Formulation 2 | Formulation 6 |
| Comparative Example 3 | Formulation 3 | — |
| Example 4 | Formulation 3 | Formulation 4 |
| Example 5 | Formulation 3 | Formulation 5 |
| Example 6 | Formulation 3 | Formulation 7 |

TABLE IV

Imaging effluence during and immediately after imaging

| Examples | Imaging Effluence |
|---|---|
| Comparative Example 1 | Strong |
| Example 1 | Much reduced |
| Comparative Example 2 | Very faint |
| Example 2 | Eliminated |
| Example 3 | Eliminated |
| Comparative Example 3 | Very faint |
| Example 4 | Eliminated |
| Example 5 | Eliminated |
| Example 6 | Eliminated |

In Comparative Example 4 and Examples 7 and 8, in which a diazonium additive was employed, thermally sensitive formulations were prepared as indicated in Table V (parts by weight). Each formulation containing 4% by weight of solids was coated with a #3 RK wire wound rod onto a grained and anodized 0.30 mm aluminum substrate to provide a dry coverage of 100 mg/ft$^2$. Each formulation in the table included FC430 (10% in water), a fluorosurfactant obtained from 3M. The resulting plates were allowed to air dry. A test image was written onto the plate at 300 mJ/cm$^2$ using a CREO TRENDSETTER plate setter. A strong sulfur-related effluence was detected during and immediately after imaging in Comparative Example 4. A very mild significantly reduced effluence was detected during and immediately after imaging in Examples 7 and 8.

Each imaged printing plate was mounted on the plate cylinder of a commercially available full-page printing press (A. B. Dick 9870 duplicator) for a press run. A commercial black ink and Varn Universal Pink fountain solution (from Varn Products Co.) were used. Each printing plate was developed on press and printed for at least 1,000 impressions.

TABLE V

| Components | Comparative Example 4 | Example 7 | Example 8 |
|---|---|---|---|
| Thiosulfate polymer | 0.92 | 0.92 | 0.92 |
| Compound I | 0.14 | 0.14 | 0.14 |
| De-ionized water | 9.58 | 9.58 | 9.58 |
| Methanol | 2.40 | 2.40 | 2.40 |
| Acetone | 12.0 | 12.0 | 12.0 |
| FC430 (10% in water) | 0.014 | 0.014 | 0.014 |
| Diazonium salt VII | — | 0.18 | — |
| Diazonium salt VIII | — | — | 0.16 |

In Comparative Example 5 and Example 9, in which an iodonium additive was employed, thermally sensitive formulations were prepared as indicated in Table VI (parts by weight). Each formulation in the table included FC430 (10% in water). The printing plates were prepared as described in Comparative Example 4 and imaged at 500 mJ/cm2 using a CREO TRENDSETTER plate setter. A very mild sulfur-related effluence was detected during and immediately after imaging in Comparative Example 5. The effluence was completely eliminated during and immediately after imaging in Example 9. The imaged printing plates were used to produce at least 1,000 printed sheets of good quality on the A. B. Dick press.

TABLE VI

| Components | Comparative Example 5 | Example 9 |
|---|---|---|
| Thiosulfate polymer | 0.80 | 0.11 |
| Compound II | 0.12 | 0.017 |
| De-ionized water | 12.64 | 1.15 |
| Methanol | — | 0.28 |
| Acetone | — | 1.43 |
| n-Propanol | 8.40 | — |
| FC430 (10% in water) | 0.012 | 0.010 |
| Iodonium salt | — | 0.013 |

In Comparative Examples 6–8 and Example 10, in which a copper(I) additive was employed, thermally sensitive formulations were prepared as indicated in Table VII. The same formulation was used for Comparative Example 9 as for Comparative Example 8 except that compound IV was used instead of compound V. Example 11 was the same as Example 10 except that the compound used was compound IV. In all the examples of Table VI, the printing plates were prepared as described in Comparative Example 4. Each plate was imaged at 830 nm on a plate setter like the commercially available CREO TRENDSETTER (but smaller in size) using 4 doses: 364, 447, 579, and 820 mJ/cm$^2$. A very faint sulfur-related effluence was detected during and immediately after imaging in Comparative Examples 6 and 9. A much stronger effluence was detected in Comparative Examples 7 and 8. The effluence was completely eliminated during and immediately after imaging in Examples 10 and 11.

The imaged printing plates were used to produce at least 1,000 printed sheets of good quality on the A. B. Dick press. The printing plates in Example 10 showed very clean background during printing and much less dye stain on the plate compared to the plate in Comparative Example 6. The printing plates in Comparative Examples 7 and 8 showed slight background toning after a few hundred impressions.

TABLE VII

| Components | Comparative Example 6 | Comparative Example 7 | Comparative Example 8 | Example 10 |
|---|---|---|---|---|
| Thiosulfate polymer | 0.33 | 0.33 | 0.33 | 0.33 |
| Compound V | 0.033 | 0.033 | 0.033 | 0.033 |
| De-ionized water | 1.87 | 1.87 | 1.87 | 1.87 |
| Methanol | 2.3 | 2.3 | 2.3 | 2.3 |
| Acetone | 4.5 | 4.5 | 4.5 | 4.5 |
| Cu(I) gluconate | — | — | — | 0.033 |
| Na gluconate | — | — | 0.033 | — |
| D-gluconic acid | — | 0.033 | — | — |

In Comparative Examples 10 and 11 and Examples 12 and 13, in which an alkoxypyridinium additive was employed, the thermally sensitive formulations were prepared as indicated in Table VIII. The printing plates in all the examples were prepared as described in Comparative Example 4. Each printing plate was imaged as described in Comparative Examples 6–8. A strong sulfur-related effluence was detected during and immediately after imaging in Comparative Example 10. A significantly reduced effluence was detected in Example 12. A very mild sulfur-related effluence was detected during and immediately after imaging in Comparative Example 11. The effluence was almost completely eliminated during and immediately after imaging in Example 13. The imaged printing plates were used to produce at least 1,000 printed sheets of good quality on the A. B. Dick press.

TABLE VIII

| Components | Comparative Example 10 | Example 12 | Comparative Example 11 | Example 13 |
|---|---|---|---|---|
| Thiosulfate polymer | 0.33 | 0.33 | 0.33 | 0.33 |
| Compound I | 0.033 | 0.033 | — | — |
| Compound II | — | — | 0.033 | 0.033 |
| De-ionized water | 3.30 | 3.30 | 3.30 | 3.30 |
| Methanol | 5.40 | 5.40 | 5.40 | 5.40 |
| Alkoxy-pyridinium additive | — | 0.033 | — | 0.033 |

In Examples 14 and 15, in which a maleimide additive was employed, the formulations were the same as for Examples 12 and 13, respectively, except that a maleimide was used instead of an alkoxypyridinium. The printing plates in all the examples were prepared as described in Comparative Example 4. Each printing plate was imaged as described in Comparative Examples 6–8. A significantly reduced effluence was detected in Example 14 compared to the strong effluence of Comparative Example 10. The effluence was almost completely eliminated during and immediately after imaging in Example 15 compared to the very mild effluence of Comparative Example 10. The imaged printing plates were used to produce at least 1,000 printed sheets of good quality on the A. B. Dick press.

It should be understood that various changes and modifications to the preferred embodiments described herein will be apparent to those skilled in the art. Such changes and modifications can be made without departing from the spirit and scope of this invention and without diminishing its attendant advantages. It is therefore intended that such changes and modifications be covered by the appended claims.

We claim:

1. A method for producing a printing plate precursor comprising applying to a substrate a composition comprising:

(a) a photothermal converter;

(b) at least one polymer comprising thiosulfate groups; and (c) a diazonium, iodonium, copper(I), alkoxypyridinium maleimide additive or mixtures thereof.

2. The method of claim 1, wherein the photothermal converter is an infrared dye.

3. The method of claim 2, wherein the infrared dye has the formula of compounds I, II, III, IV or V

I

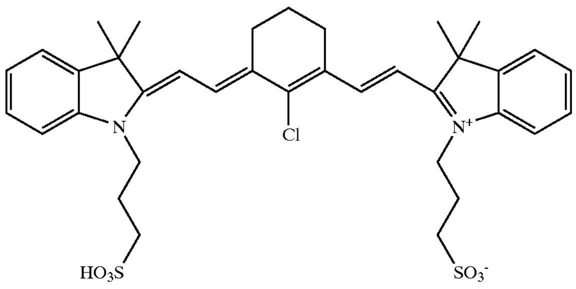

II

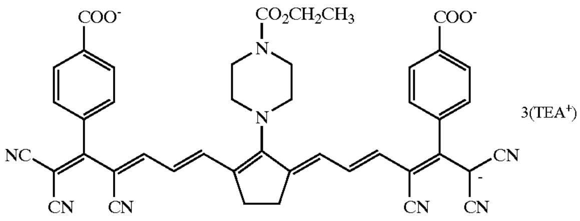

III

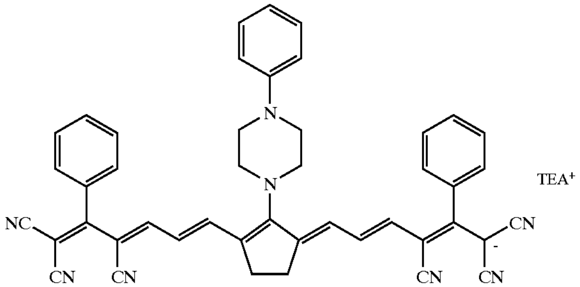

IV

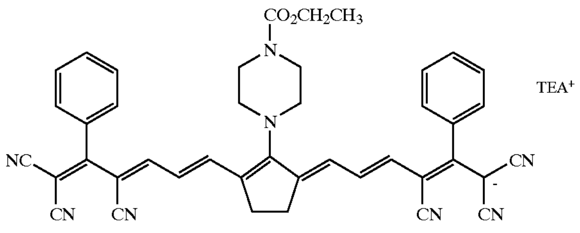

-continued

V

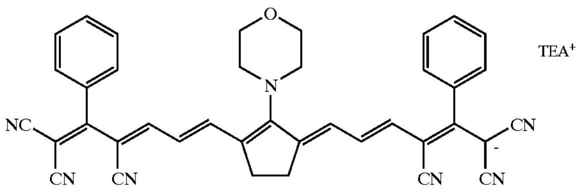

and wherein $TEA^+$ is a triethylammonium cation.

4. The method of claim 1, wherein the polymer comprising thiosulfate groups has a molecular weight in the range of 1,000–1,000,000.

5. The method of claim 1, wherein the number of thiosulfate-containing monomeric units in the polymer comprising thiosulfate groups is from about 10% to about 100% of the total number of monomeric units.

6. The method of claim 1, wherein the polymer comprising thiosulfate groups is the polymer having structure VIa VIa

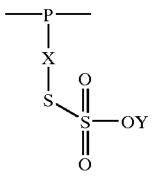

wherein P represents a polymeric backbone, X is a divalent linking group, and Y is a hydrogen or a cation.

7. The method of claim 1, wherein the polymer comprising thiosulfate groups is the polymer having structure VIb VIb

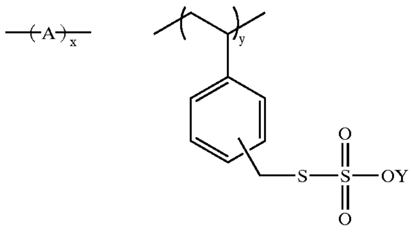

wherein y has a nonzero value, the ratio x:y ranges from 0 to about 9, A is an unsaturated polymerizable comonomer, and Y is a hydrogen or a cation.

8. The method of claim 7, wherein A is an acrylate, methacrylate, styrene and its derivatives, acrylamide, methacrylamide, olefin, vinyl halide, or combinations thereof.

9. The method of claim 1, wherein the coating composition comprises about 1 to about 25 wt % of solids.

10. The method of claim 1, wherein the coating composition provides a dry coverage of about 10 to about 1000 $mg/ft^2$.

11. The method of claim 1, wherein the diazonium additive is compound VII or VIII

VII

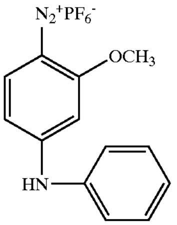

VIII

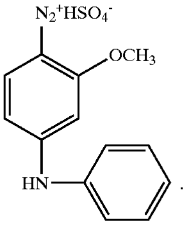

12. The method of claim 1, wherein the iodonium additive is compound IX

IX

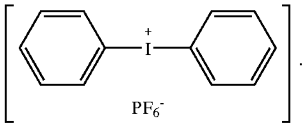

13. The method of claim 1, wherein the copper(I) additive is copper(I) gluconate.

14. The method of claim 1, wherein the alkoxypyridinium additive is compound X

X

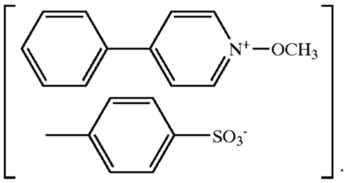

15. The method of claim 1, wherein the maleimide additive is N-ethylmaleimide.

16. A printing plate precursor comprising:

(a) a substrate, and (b) a coating applied to the substrate, the coating comprising (i) a photothermal converter;

(ii) at least one polymer comprising thiosulfate groups; and (iii) a diazonium, iodonium, copper(I), alkoxypyridinium, maleimide additive or mixtures thereof.

* * * * *